(12) United States Patent
Ikeya

(10) Patent No.: US 6,440,846 B1
(45) Date of Patent: Aug. 27, 2002

(54) METHOD FOR FORMING SEMICONDUCTOR DEVICE

(75) Inventor: Masahisa Ikeya, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/584,729

(22) Filed: Jun. 1, 2000

(30) Foreign Application Priority Data

Oct. 12, 1999 (JP) .......................................... 11-289102

(51) Int. Cl.[7] .......................................... H01L 21/4763
(52) U.S. Cl. .......................................... 438/639; 438/619
(58) Field of Search .......................... 438/613, 619, 438/637, 638, 639, 640, 666, 668

(56) References Cited

U.S. PATENT DOCUMENTS

| | | | | |
|---|---|---|---|---|
| 5,037,780 A | * | 8/1991 | Fujimoto et al. | ............ 438/107 |
| 5,191,479 A | * | 3/1993 | Tsuchida | ..................... 359/742 |
| 5,316,610 A | * | 5/1994 | Tamaki et al. | ............ 156/379.6 |

* cited by examiner

Primary Examiner—David Nelms
Assistant Examiner—David Nhu
(74) Attorney, Agent, or Firm—Volentine Francos, PLLC

(57) ABSTRACT

In a method for forming a semiconductor device, when polishing the wafer, the photo-resin so as to cure with ultraviolet is buried. Then, after polishing and forming the back side electrode, the photo-resin is removed by organic solvent. Accordingly, the method can improve reliability of bonding and simplify process flow without decreasing electrical characteristics.

16 Claims, 6 Drawing Sheets

METHOD FOR FORMING SEMICONDUCTOR DEVICE

BACKGROUND OF THE INVENTION

1. Field of the Invention

The present invention generally relates to a method for forming a semiconductor device, and more particularly, the present invention relates to the method for forming the semiconductor device using a photo-curing resin.

This application is a counterpart of Japanese application Serial Number 289102/1999, filed Oct. 12, 1999, the subject matter of which is incorporated herein by reference.

2. Description of the Related Art

In general, a method for burying a via-hole is the following:

FIG. 3A–FIG. 3I are cross-sectional views showing a method for forming GaAs IC (Integrated Circuit).

As shown in FIG. 3A, a GaAs substrate 1 is provided.

As shown in FIG. 3B, a first photo-resist 2 is coated on the GaAs substrate 1. A plurality of first photo-resist patterns 2 are formed on the GaAs substrate 1 using photo-lithography technique. As a result, a plurality of openings 3 are formed between the first photo-resist patterns 2, respectively. The first photo-resist patterns 2 serve as first masks.

As shown in FIG. 3C, a plurality of via-holes 4 having a depth of 70 μm are formed in the GaAs substrate 1 using dry etching technique.

As shown in FIG. 3D, after removing the first photo-resist patterns 2, a plurality of second photo-resist patterns 5 is formed on the GaAs substrate 1 using photo-lithography technique. In this time, a plurality of openings 6 are formed so as to expose the openings 3. The second photo-resist patterns 5 serve as second masks.

As shown in FIG. 3E, a plurality of plating gold (Au) 7 is formed in the via-holes 4 using electroless plating technique with the second masks. Then, the second masks is removed.

As shown in FIG. 3F, a polyimide 8 having a coefficient of viscosity of 35 cp is formed so as to extend from the GaAs substrate 1 to the plating gold 7. Here, a polyimide coating condition: the number of rotations is 1000 [rpm], a thickness on the GaAs substrate 1 is 10 μm. Then, an entire structure is baked at one hour, 350° C. As a result, the polyimide 8 is cured. Adhesion between the plating gold 7 and the polyimide 8 is improved and hardness for the polyimide 8 is increased. As a result, the cured polyimide 8 can improve to resist to impact when polishing as reinforcing material.

As shown in FIG. 3G, the cured polyimide 8 is etched back. As a result, the cured polyimide 8 is buried in the via-holes 4.

As shown in FIG. 3H, the entire structure put up a supporting base of a glass substrate 10 via a wax at the via-holes forming side. Then, the GaAs substrate 1 and the plating gold 7 are polished a thickness of 50 μm from a back side until exposing the polyimide 8.

As shown in FIG. 3I, a backside electrode 12, for example gold (Au), is formed on the polished surface 11 using vacuum evaporation technique. The backside electrode 12 is electrically connected to the plating gold 7.

It is desired to improve reliability of bonding and simplify process flow without decreasing electrical characteristics.

SUMMARY OF THE INVENTION

An object of the present invention is to provide a method for forming a semiconductor device that can improve reliability of bonding and simplify process flow without decreasing electrical characteristics.

According to one aspect of the present invention, for achieving the above object, there is provided a method for forming a semiconductor device comprising: providing a substrate having a first main surface and a second main surface opposite to the first main surface; forming a via-hole in the first main surface of the substrate; forming a plated layer in the via-hole; burying a photo-resin on the plated layer in the via-hole; curing the photo-resin; removing the substrate and the plated layer from the second main surface side until exposing the cured photo-resin; removing the cured photo-resin; and forming an electrode layer on the removed surface so as to electrically connect to the plated layer.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A method for forming a semiconductor device according to a first preferred embodiment of the present invention will hereinafter be described in detail with reference to the accompanying drawings.

FIG. 1A–FIG. 1J are cross-sectional views showing a method for forming a semiconductor device according to a first preferred embodiment of a present invention.

Figure 1A:
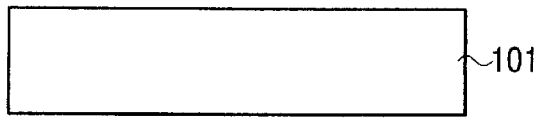
FIG. 1A–FIG. 1J are cross-sectional views showing a method for forming a semiconductor device according to a first preferred embodiment of a present invention.

As shown in FIG. 1A, a GaAs substrate 101 is provided.

Figure 1B:
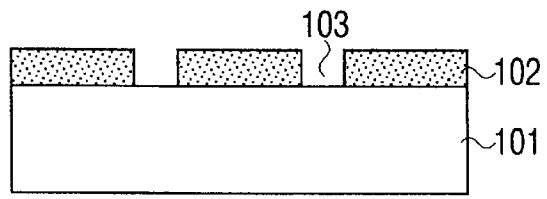

As shown in FIG. 1B, a first photo-resist 102 is coated on the GaAs substrate 101. A plurality of first photo-resist patterns 102 are formed on the GaAs substrate 101 using photo-lithography technique. As a result, a plurality of openings 103 are formed between the first photo-resist patterns 102, respectively. The first photo-resist patterns 102 serve as first masks.

Figure 1C:
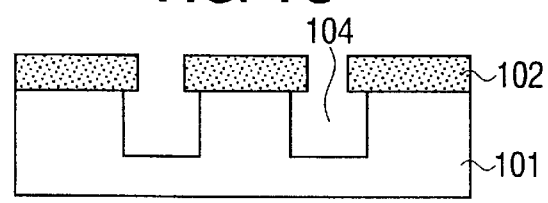

As shown in FIG. 1C, a plurality of via-holes 104 having a depth of 70 μm are formed in the GaAs substrate 101 using dry etching technique with the first photo-resist patterns 102 as the first masks.

Figure 1D:
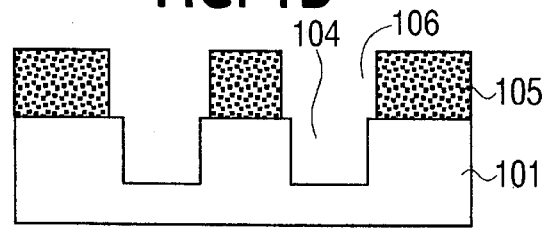

As shown in FIG. 1D, after removing the first photo-resist patterns 102, a plurality of second photo-resist patterns 105 is formed on the GaAs substrate 101 using photo-lithography technique. In this time, a plurality of openings 106 are formed so as to expose the via-holes 104. The second photo-resist patterns 105 serve as second masks.

Figure 1E:
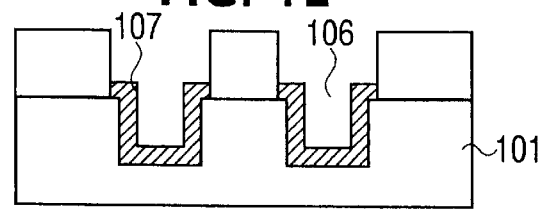

As shown in FIG. 1E, a plurality of plating layer 107, such as gold (Au), are formed in the via-holes 104 using electroless plating technique with the second photo-resist patterns 105 as the second masks. Then, the second photo-resist patterns 105 are removed.

Figure 1F:
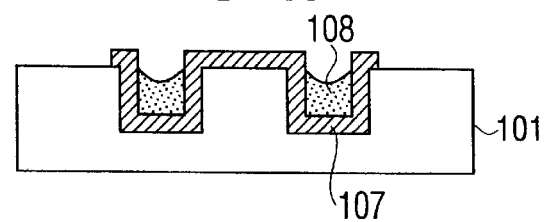

As shown in FIG. 1F, a photo-resin 108 having a coefficient of viscosity of 4 cp is formed so as to extend from the GaAs substrate 101 to the plating layer 107. Here, a photo-resin coating condition: the number of rotations is 2000 [rpm], a thickness on the GaAs substrate 101 is 50 µm. As it has coefficient of viscosity lower than the polyimide, the most of the photo-resin 108 on the GaAs substrate 101 is blown away. As a result, the photo-resin 108 is buried in the via-holes 104.

Figure 1G:
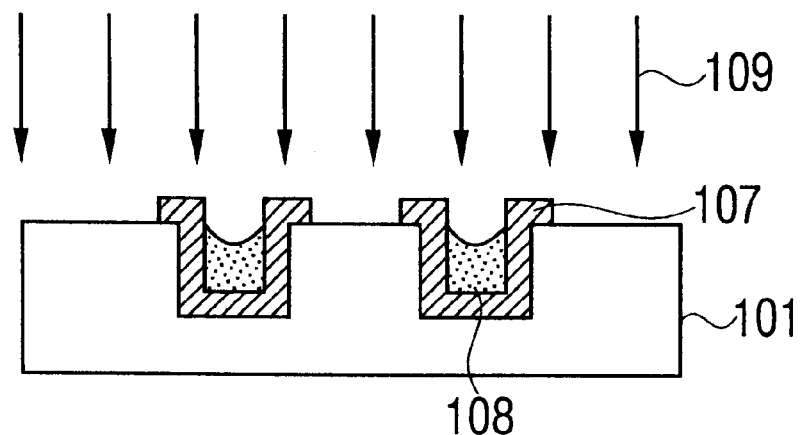

As shown in FIG. 1G, the photo-resin 108 is cured using ultraviolet 109, 180 [mw/cm$^2$], more than 10 [sec]. As a result, adhesion between the photo-resin 108 and the plating layer 107 is improved and hardness for the photo-resin 108 is increased. As a result, the cured photo-resin 108 can improve to resist to impact when polishing as reinforcing material.

Figure 1H:
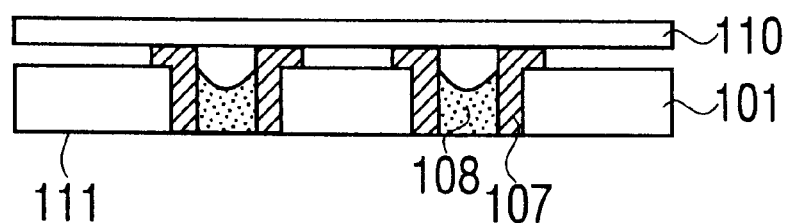

As shown in FIG. 1H, the entire structure put up a supporting base of a glass substrate 110 via a wax at the via-holes 104 forming side. Then, the GaAs substrate 101 and the plating layer 107 are polished a thickness of 50 µm from a back side until exposing the cured photo-resin 108. A part of the cured photo-resin 108 is also polished. In this time, as the cured photo-resin 108 is buried in the via-hole 104, the plated layer 107 in the via-hole 104 is reinforced by the cured photo-resin 108. As a result, the plated layer 107 can not come off from the GaAs substrate 101.

Figure 1I:
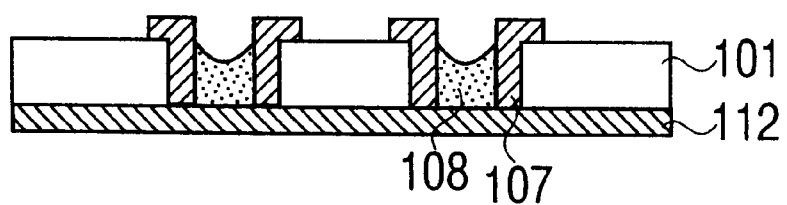

As shown in FIG. 1I, a backside electrode 112, such as gold (Au), is formed on the polished surface 111 using vacuum evaporation technique. The backside electrode 112 is electrically connected to the plating layer 107.

Figure 1J:
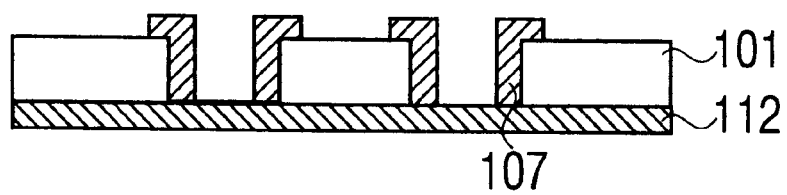

As shown in FIG. 1J, the cured photo-resin 108 in the via-hole 104 is removed by organic solvent.

As mentioned above, the first preferred embodiment can omit baking process for curing because of curing with ultraviolet. As a result, it can improve yield without decreasing electrical characteristic including Schottky characteristic for FET(Field Effect Transistor) and so on.

Further, because the cured photo-resin does not remain, the first preferred embodiment can improve yield of exterior.

Further, because the cured photo-resin can remove using organic solvent, there is not particle in the via-hole when shipping end-product. As a result, the first preferred embodiment can improve yield.

FIG. 2A–FIG. 2J are cross-sectional views showing a method for forming a semiconductor device according to a second preferred embodiment of a present invention.

Figure 2A:
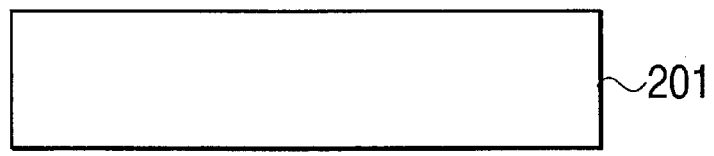
FIG. 2A–FIG. 2H are cross-sectional views showing a method for forming a semiconductor device according to a second preferred embodiment of a present invention.

As shown in FIG. 2A, a GaAs substrate 201 is provided.

Figure 2B:
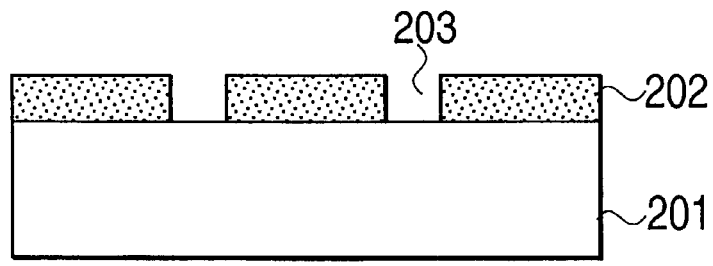

As shown in FIG. 2B, a first photo-resist 202 is coated on the GaAs substrate 201. A plurality of first photo-resist patterns 202 are formed on the GaAs substrate 201 using photo-lithography technique. As a result, a plurality of openings 203 are formed between the first photo-resist patterns 202, respectively. The first photo-resist patterns 202 serve as first masks.

Figure 2C:
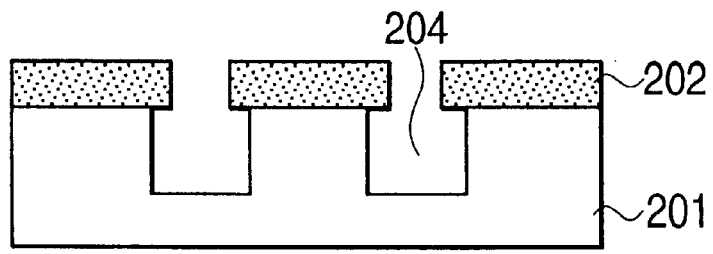

As shown in FIG. 2C, a plurality of via-holes 204 having a depth of 70 µm are formed in the GaAs substrate 201 using dry etching technique with the first photo-resist patterns 202 as the first masks.

Figure 2D:
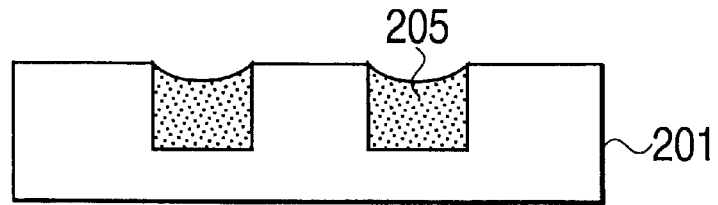

As shown in FIG. 2D, after removing the first photo-resist patterns 202, a photo-resin 205 having a coefficient of viscosity of 4 cp is formed so as to extend from the GaAs substrate 201 to the via-holes 204. Here, a photo-resin coating condition: the number of rotations is 2000 [rpm], a thickness on the GaAs substrate 201 is 50 µm. As it has coefficient of viscosity lower than the polyimide, the most of the photo-resin 205 on the GaAs substrate 201 is blown away. As a result, the photo-resin 205 is buried in the via-holes 204.

Figure 2E:
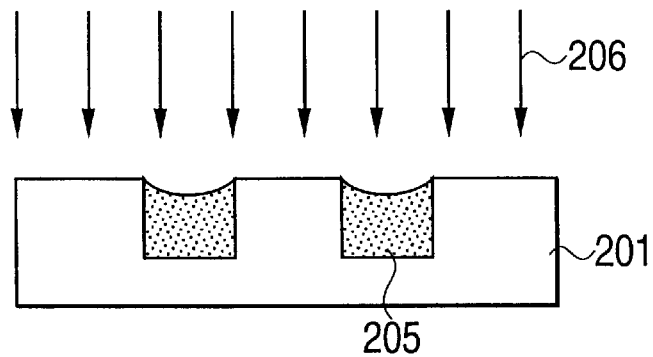

As shown in FIG. 2E, the photo-resin 205 is cured using ultraviolet 206, 180 [mw/cm$^2$], more than 10 [sec]. As a result, adhesion between the photo-resin 205 and the GaAs substrate 201 is improved and hardness for the photo-resin 205 is increased. As a result, the cured photo-resin 205 can improve to resist to impact when evaporating and doing photolithography technique as smoothing material and so on.

Figure 2F:
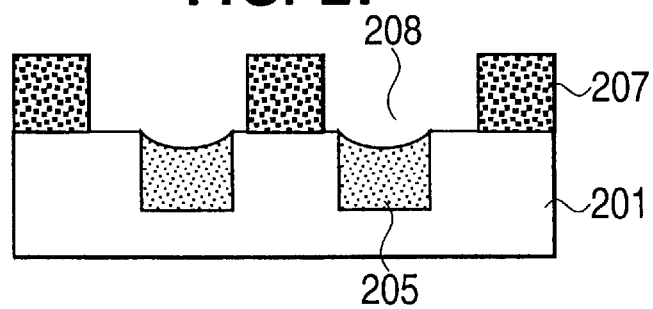

As shown in FIG. 2F, a plurality of second photo-resist patterns 207 is formed on the GaAs substrate 201 using photo-lithography technique. In this time, a plurality of openings 208 are formed so as to expose the cured photo-resins 205. The second photo-resist patterns 207 serve as second masks.

Figure 2G:
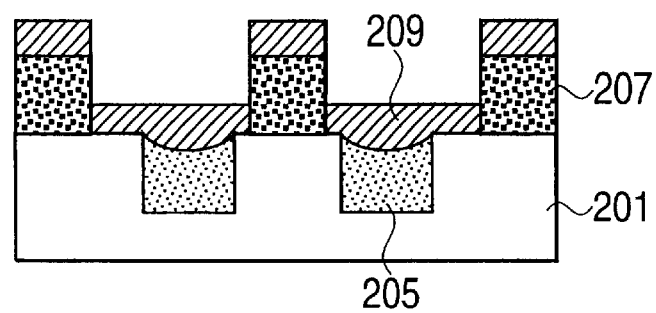

As shown in FIG. 2G, a conductive layer 209, such as gold, is evaporated on the entire structure. The conductive layer 209 has a thickness of 700 [nm].

Figure 2H:
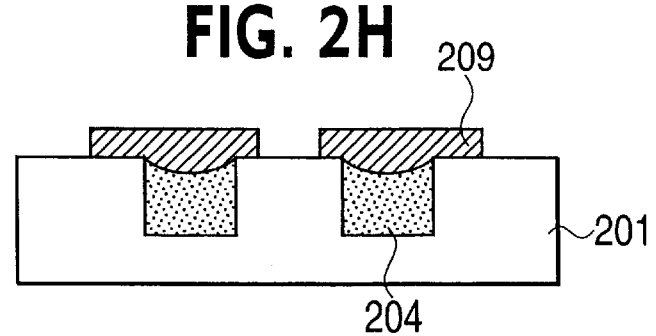
Figure 3A:
FIG. 3A–FIG. 3I are cross-sectional views showing a method for forming GaAs IC (Integrated Circuit).
Figure 3B:
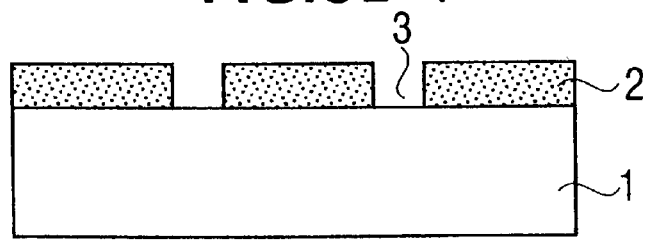
Figure 3C:
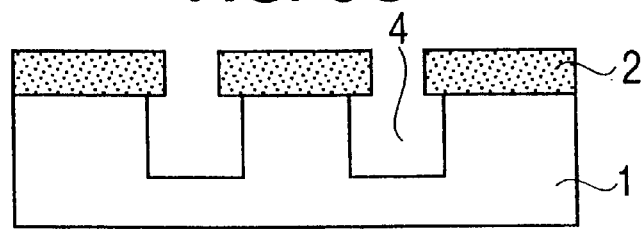
Figure 3D:
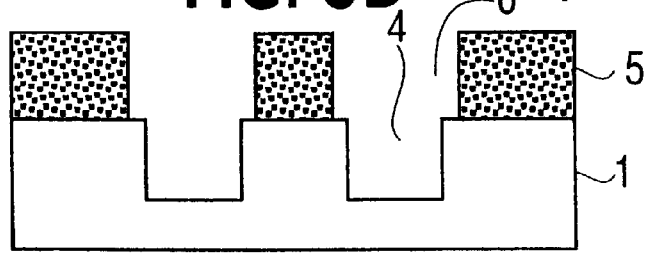
Figure 3E:
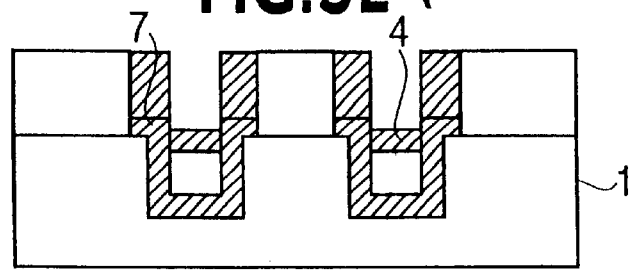
Figure 3F:
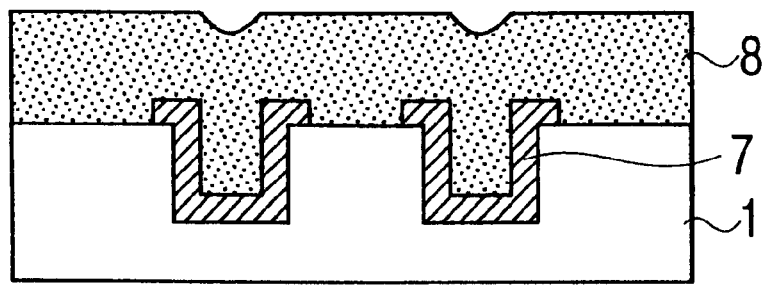
Figure 3G:
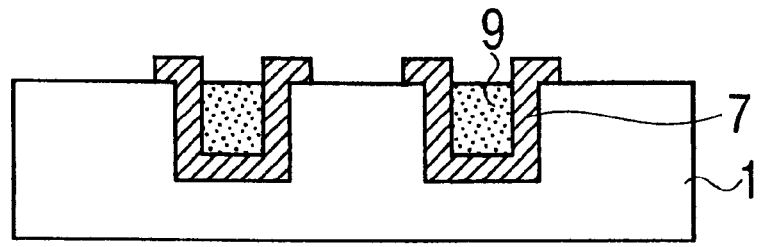
Figure 3H:
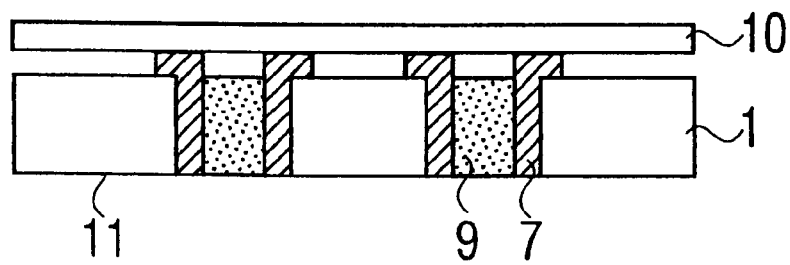
Figure 3I:
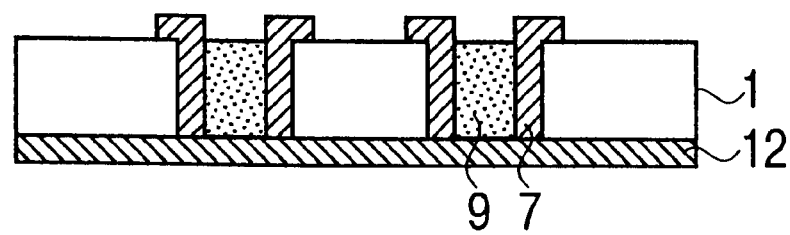

As shown in FIG. 2H, the second photo-resist patterns 207 and the cured photo-resin 205 are removed by organic solvent. Therefore, with lift-off technique, the conductive layers 209 can be selectively deposited above the via-holes 204. The conductive layers 209 serves as air-bridge interconnections.

As mentioned above, when forming the air-bridge interconnections, the second photo-resist patterns and the cured photo-resin can be removed by organic solvent, simultaneously. Accordingly, the second preferred embodiment can simplify processes for forming the air-bridge interconnections. Further, there is not particle in the via-hole when shipping end-product. Accordingly, the second preferred embodiment can improve yield.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method for forming a semiconductor device, comprising:

providing a substrate having a first main surface and a second main surface opposite to the first main surface;

forming a via-hole partially through the substrate such that an opening of the via-hole is at the first main surface of the substrate;

forming a plated layer on a bottom surface and side surfaces of the via-hole;

burying a photo-resin within the via-hole and on the plated layer;

curing the photo-resin;

polishing the second main surface of the substrate so as to remove a portion of the substrate and the plated layer formed on the bottom surface of the via-hole to expose the cured photo-resin;

removing the cured photo-resin; and forming an electrode layer on the polished second main surface of the substrate so as to electrically connect the electrode layer to the plated layer formed on the side surfaces of the via-hole.

2. A method for forming a semiconductor device as claimed in claim 1, wherein said forming a via-hole includes:

forming a photo-resist pattern on the first main surface of the substrate; and etching the substrate using the photo-resist pattern as a mask.

3. A method for forming a semiconductor device as claimed in claim 1, wherein the plated layer is made of gold.

4. A method for forming a semiconductor device as claimed in claim 1, wherein the curing process uses ultra violet.

5. A method for forming a semiconductor device as claimed in claim 1, wherein the electrode layer is made of gold.

6. A method for forming a semiconductor device comprising:

providing a substrate;

forming a via-hole in the substrate;

burying a photo-resin in the via-hole;

curing the photo-resin;

forming a conductive layer on the substrate and the cured photo-resin; and removing the cured photo-resin;

wherein the conductive layer serving as an air bridge wiring.

7. A method for forming a semiconductor device as claimed in claim 6, wherein the via-hole is formed by using a photo-resist on the substrate.

8. A method for forming a semiconductor device as claimed in claim 6, wherein the conductive layer is made of gold.

9. A method for forming a semiconductor device as claimed in claim 6, wherein the curing process uses ultra violet.

10. A method for forming a semiconductor device as claimed in claim 1, wherein the photo-resin is buried using a rotation coating method.

11. A method for forming a semiconductor device as claimed in claim 6, wherein the photo-resin is buried using a rotation coating method.

12. A method for forming a semiconductor device as claimed in claim 1, wherein the cured photo-resin is removed by an organic solvent.

13. A method for forming a semiconductor device as claimed in claim 6, wherein the cured photo-resin is removed by an organic solvent.

14. A method for forming a semiconductor device, comprising:

providing a substrate having a main surface;

forming a via-hole partially through the substrate such that an opening of the via-hole is at the main surface of the substrate;

filling the via-hole with a photo-resin and then curing the photo-resin within the via-hole;

forming a conductive layer on the main surface of the substrate and over the cured photo-resin; and removing the cured photo-resin from the via-hole such that the conductive layer defines an air bridge wiring extending across the opening of the via-hole.

15. A method for forming a semiconductor device as claimed in claim 14, wherein the photo-resin is filled into the via-hole using a rotation coating method.

16. A method for forming a semiconductor device as claimed in claim 14, wherein the cured photo-resin is removed by an organic solvent.

* * * * *